(12) United States Patent
Shrowty et al.

(10) Patent No.: US 7,237,218 B2
(45) Date of Patent: Jun. 26, 2007

(54) OPTIMIZING DYNAMIC POWER CHARACTERISTICS OF AN INTEGRATED CIRCUIT CHIP

(75) Inventors: Vikram Shrowty, Fremont, CA (US); Santhanakris Raman, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 247 days.

(21) Appl. No.: 10/927,919

(22) Filed: Aug. 26, 2004

(65) Prior Publication Data

US 2006/0046353 A1    Mar. 2, 2006

(51) Int. Cl.
*G06F 17/50*    (2006.01)
(52) U.S. Cl. ........................................ 716/13
(58) Field of Classification Search ................... 716/13, 716/2, 5, 8, 10, 16; 174/255
See application file for complete search history.

(56) References Cited

U.S. PATENT DOCUMENTS

| | | | |
|---|---|---|---|
| 5,264,729 A * | 11/1993 | Rostoker et al. | 257/774 |
| 5,898,403 A * | 4/1999 | Saitoh et al. | 343/700 MS |
| 6,198,362 B1 * | 3/2001 | Harada et al. | 333/12 |
| 6,617,621 B1 * | 9/2003 | Gheewala et al. | 257/207 |
| 6,969,808 B2 * | 11/2005 | Shiraki | 174/255 |
| 2004/0088669 A1 * | 5/2004 | Loh et al. | 716/13 |
| 2004/0158805 A1 * | 8/2004 | Kanamoto et al. | 716/11 |
| 2004/0170043 A1 * | 9/2004 | Theel | 365/63 |
| 2004/0217479 A1 * | 11/2004 | Katsura et al. | 257/758 |
| 2004/0222528 A1 * | 11/2004 | Kunikiyo | 257/758 |
| 2005/0115740 A1 * | 6/2005 | Sasaki et al. | 174/255 |
| 2005/0123677 A1 * | 6/2005 | Nicolaisen | 427/96.1 |
| 2005/0181546 A1 * | 8/2005 | Madurawe | 438/132 |
| 2005/0230146 A1 * | 10/2005 | Koyama | 174/255 |
| 2006/0055049 A1 * | 3/2006 | Nelson et al. | 257/774 |

\* cited by examiner

*Primary Examiner*—Paul Dinh
*Assistant Examiner*—Suchin Parihar
(74) *Attorney, Agent, or Firm*—Strategic Patent Group

(57) ABSTRACT

The present invention optimizes the dynamic power characteristics of an integrated circuit (IC) chip. The IC chip includes a plurality of layers, wherein at least one of the layers is a power mesh layer that provides power to the IC chip, and includes a ground (Vss) net. The method includes providing at least one dummy metal mesh layer, and coupling the dummy metal mesh layer to the Vss net on the power mesh layer thereby increasing the capacitance on the Vss net.

19 Claims, 4 Drawing Sheets

OPTIMIZING DYNAMIC POWER CHARACTERISTICS OF AN INTEGRATED CIRCUIT CHIP

FIELD OF THE INVENTION

The present invention relates to integrated circuit chip design, and more particularly, to a method for optimizing dynamic power characteristics of an integrated circuit (IC) chip.

BACKGROUND OF THE INVENTION

For any chip to function optimally, it must be properly supplied with power. A common technique to improve dynamic power characteristics at switching time involves the addition of capacitance to a ground (Vss) net. This is typically accomplished by utilizing the largest wire size available for the net and/or by adding de-coupling capacitors. Another technique involves connecting dummy metal structures to the Vss net.

During the IC chip fabrication process, a chemical mechanical polishing (CMP) step is one of the final steps performed. The CMP step requires a specific distribution of metal over the surface of the chip. Each fabrication process defines a rectangular region and a minimum metal density for that region. For each such rectangular region of the chip (commonly called a "tile"), the sum of all metal area within the tile divided by the area of the tile must be greater than or equal to the prescribed minimum. If one or more tiles lack the requisite amount of metal, additional metal, referred to as "dummy metal," is deposited into the region to increase the metal distribution. The dummy metal provides no logical function other than to balance the metal to silicon distribution for the CMP process, and therefore, the dummy metal structure can be of arbitrary shape.

As stated above, the dynamic power characteristics at switching time can be improved if the dummy metal structures are connected to the Vss net. Nevertheless, because dummy metal insertion is performed as one of the final steps of the chip design flow, making these connections in a quick and efficient way is rarely possible.

Accordingly, what is needed is a method for improving dynamic power characteristics of an IC chip by optimizing the capacitance of the Vss net. The present invention addresses such a need.

BRIEF SUMMARY OF THE INVENTION

The present invention is a method for optimizing dynamic power characteristics of an integrated circuit (IC) chip, and an IC chip utilizing the method. The IC chip includes a plurality of layers, wherein at least one of the layers is a power mesh layer that provides power to the IC chip and includes a ground (Vss) net. The method includes providing at least one dummy metal mesh layer, and coupling the dummy metal mesh layer to the Vss net on the power mesh layer thereby increasing the capacitance on the Vss net.

According to the present invention, the dynamic power characteristics of the IC chip is optimized by increasing the capacitance on the Vss net. By replacing an unused programmable layer in a programmable IC chip with the dummy metal mesh layer, the benefits provided by the present invention can be enjoyed without adding cost or time to the fabrication process.

DETAILED DESCRIPTION OF THE INVENTION

The present invention relates to integrated circuit chip design, and more particularly, to a method for optimizing dynamic power characteristics of an integrated circuit (IC) chip. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Customized programmable IC chips are available to manufacturers so that IC chips can be designed to meet the specific demands and requirements of a product. For example, the RapidChip™ by LSI Logic Corporation, of California, allows a customer to customize a chip design. Here, the customer is given a "slice," which is, in essence, an incomplete chip design.

Figure 1:
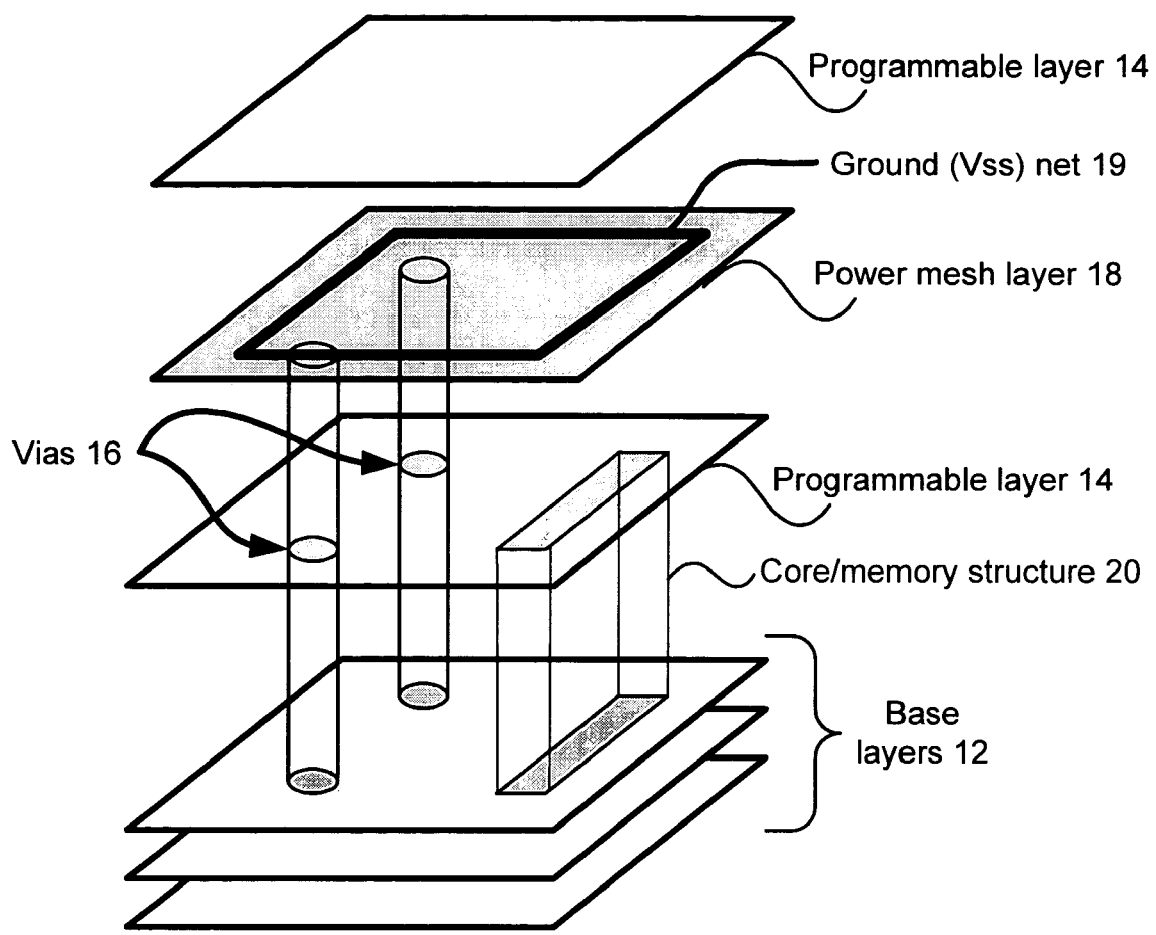
FIG. 1 is a perspective view of a plurality of layers of an IC chip.

FIG. 1 is a perspective view of a programmable IC chip. The lower (base) layers 12 of the slice 10 provide a "sea-of-gates like" base functionality that can be customized by inserting routes on the higher layers. This customization process is referred to as an "instantiation" of the slice and the customized slice is called an "instance." The higher layers that are routed during instantiation are called programmable layers 14. Only programmable layers 14 are modified during instantiation. The base layers 12 remain fixed.

Power is provided to the base layers 12 through vias 16 that drop from a power mesh layer 18 in one of the higher layers. The power mesh layer 18 includes a ground (Vss) net 19, as is well known in the art. This power mesh layer 18 is also fixed in the slice 10 and no modifications are made to it during instantiation.

In addition to uncharacterized cells on the base layers 12, a slice 10 may provide one or more core and memory structures 20. These structures 20 span multiple layers and represent fixed parts of the programmable layers 14.

Figure 2A:
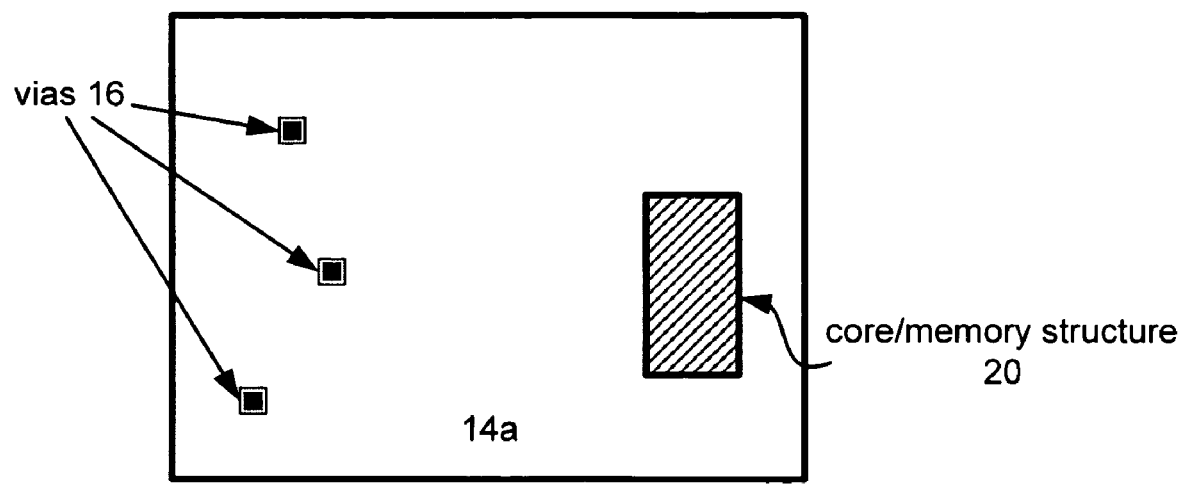
FIG. 2A is a plan view of an unprogrammed programmable layer.

FIG. 2A is a plan view of an unprogrammed programmable layer 14a. As is shown, apart from any space occupied by vias 16 and core/memory structures 20, the unused programmable layer 14a is empty. It is populated with routes (not shown) during the instantiation process.

While the customer can insert routes to program the programmable layer 14, there is no requirement that all programmable layers 14 be programmed during instantiation. In designs of lower complexity, for example, one or more programmable layers 14 might not be programmed; i.e., those layers would not be populated with routes. Nonetheless, because of metal utilization requirements that mandate a minimum metal distribution on the layer 14, dummy metal would need to be inserted on the unprogrammed layer 14a.

Figure 2B:
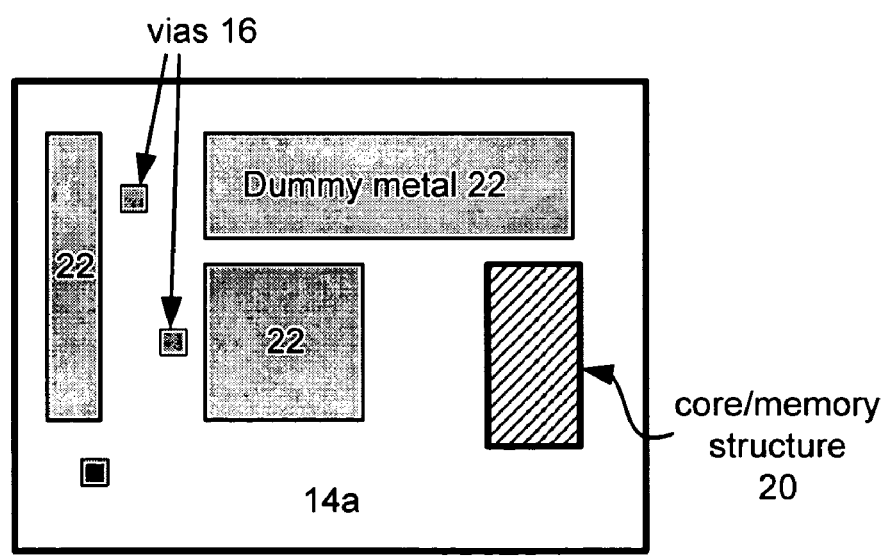
FIG. 2B is a plan view of an unused programmable layer with dummy metal inserts.

FIG. 2B is a plan view of an unprogrammed programmable layer 14a with dummy metal structures 22. As is shown, the dummy metal structures 22 are inserted arbitrarily on the unused programmable layer 14a, but do not interfere with the vias 16 and core/memory structure 20. As stated above, the dummy metal structures 22 do not affect the logical functionality of the IC chip, but rather are relevant to the fabrication process.

According to the preferred embodiment of the present invention, unprogrammed programmable layers 14a are utilized to improve the dynamic power characteristics of the chip. In particular, the unprogrammed programmable layer 14a is replaced by a dummy metal mesh layer.

Figure 3:
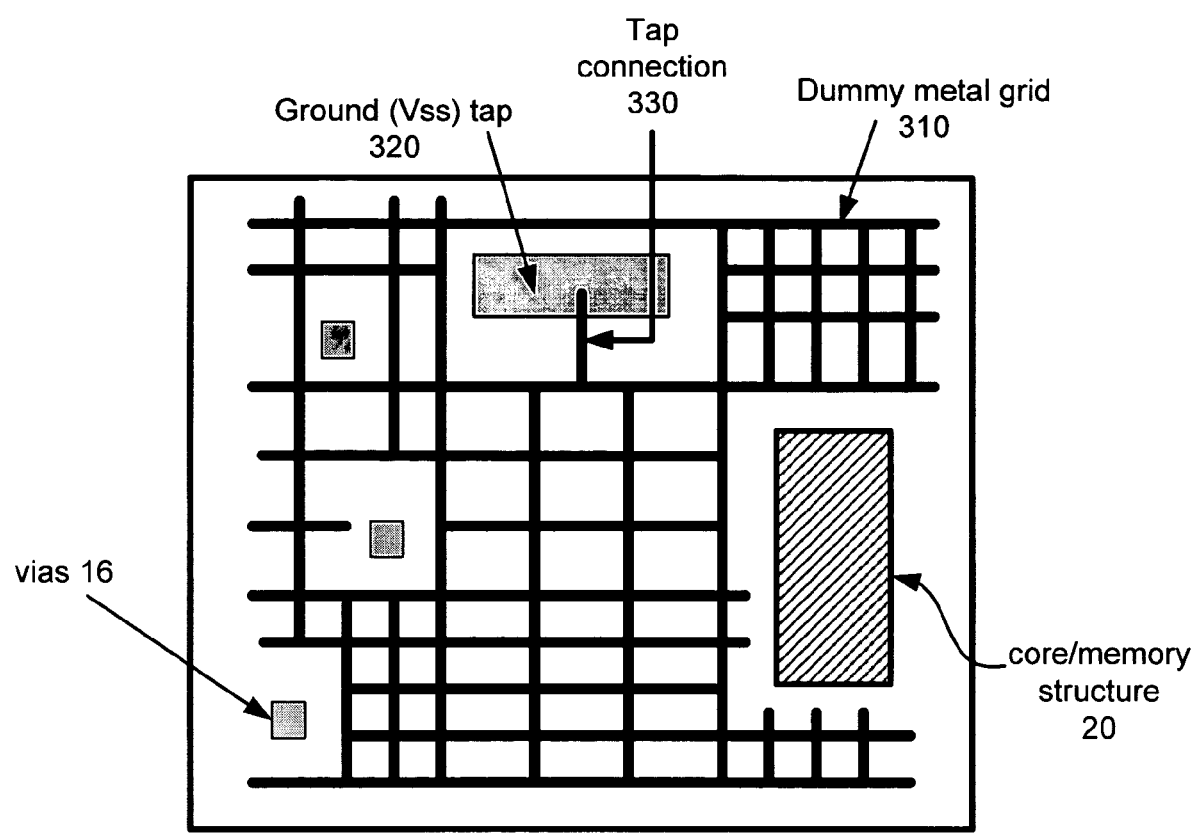
FIG. 3 is a plan view of a dummy metal mesh layer according to a preferred embodiment of the present invention.

FIG. 3 is a plan view of the dummy metal mesh layer according to a preferred embodiment of the present invention. The dummy metal mesh layer 300 includes a dummy metal grid 310 that covers a region of the layer 300 that corresponds to the empty region of the unused programmable layer 14a. The dummy metal grid 310 preferably is a simple regular grid structure made up of the thickest wires allowed by the technology and by metal-utilization rules.

In a preferred embodiment, at least one ground (Vss) tap 320 is provided on the dummy metal mesh layer 300. The Vss tap 320 is preferably a short jog. A tap connection 330 connects the dummy metal grid 310 to the Vss tap 320. The Vss tap 320 provides a path for connecting the dummy metal grid 310 on the dummy metal mesh layer 300 to the Vss net 19 on the power mesh layer 18.

Figure 4:
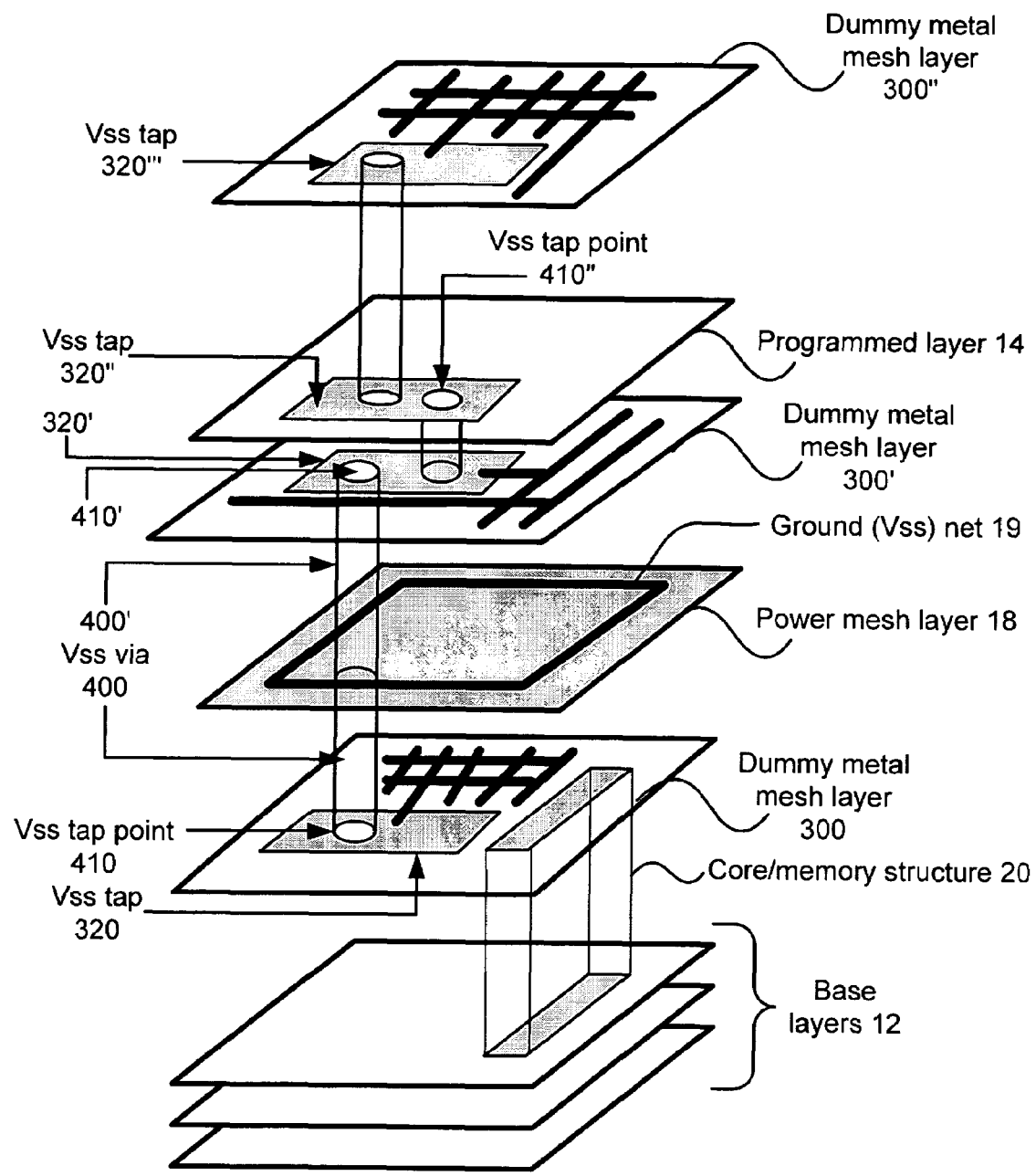
FIG. 4 is a perspective view of a plurality of layers of an IC chip according to a preferred embodiment of the present invention.

FIG. 4 is a perspective view of a plurality of layers in a programmable IC chip according to a preferred embodiment of the present invention. As is shown, a Vss via 400 drops from the Vss net 19 on the power mesh layer 18 to a Vss tap point 410 on the Vss tap 320 on the dummy metal mesh layer 300 below. In addition, another Vss via 400' extends up from the Vss net 19 to a Vss tap point 410' on a dummy metal mesh layer 300' above the power mesh layer 18. Thus, dummy metal mesh layers below 300 and above 300' the power mesh layer 18 are connected to the Vss net 19.

In a preferred embodiment, each programmed layer 14 also includes at least one Vss tap 320" that is connected to other Vss taps 320 in layers above and/or below it. While, the routing on the programmed layer 14 may or may not utilize the Vss tap 320," a dummy metal mesh layer 300" inserted above or below the programmed layer 14 can still connect to the Vss net 19 because the Vss taps 320, 320", 320'" in all layers are connected.

According to a preferred embodiment of the present invention, Vss vias 400, 400' connect the dummy metal grid 310 on dummy metal layers above 300' and below 300 the power mesh layer 18 to the Vss net 19 via the respective Vss taps 320. By connecting the dummy metal grid(s) 310 to the Vss net 19, the capacitance on the Vss net 19 is significantly increased, thereby improving the chip's dynamic power characteristics and its robustness.

The present invention has been described in the context of a programmable IC chip. By replacing unused programmable layers 14a with the dummy metal mesh layer 300, additional costs or inconveniences are not introduced into the fabrication process. For example, if an instance does not utilize a programmable layer, one mask associated with the dummy metal mesh layer 300 is automatically utilized and the dummy metal grid 310 is generated. Thus, the benefits of the present invention are realized without additional expense.

While the present invention is particularly advantageous for programmable chips, the principles of the present invention should not be limited to such chips. Indeed, depending on the circumstances, the fabrication costs associated with adding one or more dummy metal mesh layers 300 to an IC chip may be outweighed by the improvements in dynamic power characteristics and robustness.

A method and system for optimizing dynamic power characteristics of an integrated circuit (IC) chip has been disclosed. The present invention has been described in accordance with the embodiments shown, and one of ordinary skill in the art will readily recognize that there could be variations to the embodiments, any variations would be within the spirit and scope of the present invention. Accordingly, many modifications may be made by one of ordinary skill in the art without departing from the spirit and scope of the appended claims.

We claim:

1. A method for optimizing dynamic power characteristics of an integrated circuit (IC) chip, wherein the IC chip includes a plurality of layers and at least one of the layers is a power mesh layer, the method comprising:

providing at least one dummy metal mesh layer in the plurality of layers, wherein a dummy metal grid is provided on each of the at least one dummy metal mesh layers, the dummy metal grid comprising a plurality of interconnected metal lines that provide no logical functionality;

coupling the at least one dummy metal mesh layer to a ground (Vss) net on the at least one power mesh layer, wherein the coupling further comprises:

providing at least one ground tap on each of the at least one dummy metal mesh layers, wherein the at least one ground tap is a short jog; and connecting the dummy metal grid to the at least one ground tap, wherein by connecting the at least one dummy metal mesh layer to the ground (Vss) net, the capacitance on the ground (Vss) net is increased.

2. The method of claim 1, wherein coupling the at least one dummy metal mesh layer to the ground (Vss) net includes:

providing a via from the ground (Vss) net to the at least one ground tap on at least one dummy metal mesh layer.

3. The method of claim 1, wherein a first dummy metal mesh layer is disposed directly above a power mesh layer and a second dummy metal mesh layer is disposed directly below the power mesh layer and coupling the at least one dummy metal mesh layers to the ground (Vss) net includes:

providing a first via from the ground (Vss) net to the at least one ground tap on the first dummy metal mesh layer; and providing a second via from the ground (Vss) net to the at least one ground tap on the second dummy metal mesh layer.

4. The method of claim 2, wherein coupling the at least one dummy metal mesh layer to the ground (Vss) net further includes:

connecting the via to the at least one ground tap via a tap point on the at least one ground tap.

5. A method for optimizing dynamic power characteristics of a programmable integrated circuit (IC) chip, wherein the programmable chip includes a plurality of programmable layers and at least one power mesh layer, the method comprising:

identifying at least one unused programmable layer;

replacing each of the at least one unused programmable layer with a dummy metal mesh layer; and coupling each dummy metal mesh layer to a ground (Vss) net on the at least one power mesh layer, wherein by connecting each dummy metal mesh layer to the ground (Vss) net, the capacitance on the ground (Vss) net is increased.

6. The method of claim 5 further including:

providing a dummy metal grid on each dummy metal mesh layer, wherein the dummy metal grid comprises a plurality of interconnected metal lines that provide no logical functionality.

7. The method of claim 6 further including:

providing at least one ground tap on each dummy metal mesh layer, wherein the at least one ground tap is a short jog; and connecting the dummy metal grid to the at least one ground tap.

8. The method of claim 7, wherein coupling each dummy metal mesh layer to the ground (Vss) net includes:

providing a via from the ground (Vss) net to the at least one ground tap on each of the dummy metal mesh layers.

9. The method of claim 8, wherein a first dummy metal mesh layer is disposed directly above a power mesh layer and a second dummy metal mesh layer is disposed directly below the power mesh layer and coupling each dummy metal mesh layer to the ground (Vss) net includes:

providing a first via from the ground (Vss) net to the at least one ground tap on the first dummy metal mesh layer; and providing a second via from the ground (Vss) net to the at least one ground tap on the second dummy metal mesh layer.

10. The method of claim 9, wherein coupling each dummy metal mesh layer to the ground (Vss) net further includes:

connecting the via to the at least one ground tap via a tap point on the at least one ground tap.

11. The method of claim 10 further including:

coupling each dummy metal mesh layer to one another by connecting the at least one ground tap on one dummy metal mesh layer to ground taps on adjacent dummy metal mesh layers.

12. The method of claim 11 further including:

providing at least one ground tap on each programmable layer; and connecting the at least one ground tap on a programmable layer to the at least one ground tap on adjacent dummy metal mesh layers.

13. An integrated circuit chip comprising:

at least one power mesh layer for providing power to the integrated circuit chip;

a ground (Vss) net in each of the at least one power mesh layer; and at least one dummy metal mesh layer coupled to the ground (Vss) net, wherein each dummy metal mesh layer includes a dummy metal grid that comprises a plurality of interconnected metal lines that provide no logical functionality, wherein each dummy metal mesh layer further includes at least one ground tap that is a short jog, and a tap connection for connecting the dummy metal grid to the at least one ground tap, wherein by connecting the at least one dummy metal mesh layer to the ground (Vss) net, the capacitance on the ground (Vss) net is increased.

14. The chip of claim 13 further including a via from the ground (Vss) net to the at least one ground tap on at least one dummy metal mesh layer.

15. The chip of claim 13 further comprising a first via connecting the ground net to a metal mesh layer disposed directly above the power mesh layer and a second via connecting the ground to another metal mesh layer disposed directly below the power mesh layer.

16. The chip of claim 14, wherein each ground tap includes at least one tap point for connecting the via to the ground tap.

17. The chip of claim 13 further comprising:

at least one programmable layer for allowing a customer to customize the chip.

18. The chip of claim 17, wherein if at least one of the programmable layers is not programmed, it is replaced by a dummy metal mesh layer.

19. The chip of claim 18, wherein each programmable layer is coupled to each of the at least one dummy metal mesh layers.

\* \* \* \* \*